United States Patent
Zink et al.

[11] Patent Number: 5,963,045
[45] Date of Patent: Oct. 5, 1999

[54] METHOD FOR TESTING CIRCUIT BOARD ASSEMBLIES

[75] Inventors: Anthony J. Zink; Timothy J. Kelly, both of Loveland, Colo.

[73] Assignee: Hewlett Packard Company, Palo Alto, Calif.

[21] Appl. No.: 09/015,465

[22] Filed: Jan. 29, 1998

Related U.S. Application Data

[62] Division of application No. 08/581,097, Dec. 29, 1995, abandoned.

[51] Int. Cl.$^6$ .................................................. G01R 31/02
[52] U.S. Cl. ............................................. 324/754; 439/951
[58] Field of Search ................................... 324/754, 755, 324/757, 761, 762, 765; 439/951

[56] References Cited

U.S. PATENT DOCUMENTS

| | | | |
|---|---|---|---|
| 4,145,620 | 3/1979 | Dice | 307/149 |
| 4,609,240 | 9/1986 | Pistor | 439/44 |
| 4,872,843 | 10/1989 | Anstey | 439/69 |
| 5,157,829 | 10/1992 | Schmidt et al. | 29/846 |
| 5,315,241 | 5/1994 | Ewers | 324/158.1 |

*Primary Examiner*—Gerard Strecker
*Assistant Examiner*—Russell M. Kobert
*Attorney, Agent, or Firm*—Kevin M. Hart

[57] ABSTRACT

An edge-testable circuit board includes a circuit board having a planar surface and a board edge. Conductive pads are formed on the board edge and are electrically coupled to test nodes of the circuit on the circuit board. The conductive pads may be located within indentations formed on the board edge. The indentations may be half-circles, half-squares or v-shaped. The conductive pads may be formed by making plated through-holes in the circuit board, electrically coupling the plated-through holes to test nodes on the circuit board, and then removing part of the plated-through holes with a router. The removal step creates a new board edge that exposes part of the plating of the through hole. Numerous such conductive pads may be formed in one step by centering the plated-through holes on a line and passing a router down the line. The circuit board may be tested by bringing it into contact with spring-loaded test probes mounted in a test fixture. Because the conductive pads are formed on the edge of the circuit board, the direction of the force applied by the spring-loaded test probes is coplanar with the plane of the circuit board substrate material, thus reducing deformation of the circuit board during testing.

4 Claims, 10 Drawing Sheets

METHOD FOR TESTING CIRCUIT BOARD ASSEMBLIES

This is a divisional of application Ser. No. 08/581,097, filed Dec. 29, 1995, now abandoned.

FIELD OF THE INVENTION

This invention relates to circuit boards. More particularly, the invention relates to the testing of circuit boards and circuit board assemblies using electrical contacts formed on the board edge.

BACKGROUND OF THE INVENTION

Advances in integrated circuit technology have enabled discrete components to embody an increasingly high degree of functionality in an increasingly small unit of area. Even so, printed circuit boards remain the method of choice for interconnecting these discrete components. Consequently, designers of printed circuit boards have been forced to decrease trace widths and add conductor layers in order to accommodate the increased demand for off-chip connections and circuit traces per board. The result has been a dramatic rise in printed circuit board density and complexity.

These increases in density and complexity have presented challenges in the field of circuit board testing. For example, the higher the complexity of the printed circuit board, the higher the rate of board failures and the greater the cost of defects occurring at each stage of the assembly. Therefore, testing methods and apparatus have been developed to test not only completed printed circuit board assemblies, but also to test the bare boards themselves before the discrete components are attached.

The most common of these testing apparatus is the so-called "bed of nails" test fixture. A bed of nails test fixture is characterized by a supporting plate that holds numerous nail-like test probes firmly upright. The test fixture positions the probes in relation to the printed circuit board so as to engage a particular circuit node when the bed of nails and the printed circuit board are brought into contact with one another, usually by means of either a vacuum-operated or a pneumatic force. In turn, each of the individual probes is spring loaded. Thus, as the circuit board and test probes engage, the springs in the probes depress slightly. In many typical applications, a compressive force between three and eight ounces is desirable on each probe to ensure connections that are reliable and not highly resistive. Unfortunately, because multiple probes are used simultaneously, such fixtures often apply enormous forces to the printed circuit boards under test. For example, if four-ounces of test probe force were applied to each of the pins on a sixty-four pin microprocessor package, the aggregate force would equal sixteen pounds applied to a very small area of the printed circuit board, and in a direction orthogonal to the plane of the board. These types of forces cause deformation of the printed circuit board. Very frequently, the deformation causes damage.

An alternative method for gaining access to test nodes on printed circuit boards is to build one or more plug-and-socket-type test connectors onto the board for testing purposes. With this done, testing may be accomplished by simply attaching an appropriate cable to the plug-and-socket-type test connector, conducting the test, and then removing the test cable from the plug-and-socket-type connector. This method has disadvantages also. First, it decreases the throughput of the testing operation because plug-and-socket-type connectors usually require that test cables be attached and removed by hand. Second, the cost of the plug-and-socket-type connectors themselves can be prohibitive in a high-volume production. Third, adding plug-and-socket-type connectors to the board represents an additional source of potential defects and a statistically measurable cost for rework and replacement.

It is therefore an object of the present invention to gain reliable electrical access to test nodes on a printed circuit board without applying destructive forces to the circuit board.

It is a further object of the present invention to gain reliable electrical access to test nodes on a printed circuit board without the requirement of building plug-and-socket-type test connectors onto the board.

SUMMARY OF THE INVENTION

In one embodiment, the invention is a printed circuit board with conductive pads formed on the edge of the board in addition to the circuitry that is usually formed on the planar surfaces of the board. The conductive pads formed on the edge of the board are electrically coupled to test nodes within the circuitry on the planar surfaces. Thus, the conductive pads on the edge of the board provide electrical access to test nodes within the planar circuitry. Preferably, the circuit board is contoured so that the board edge includes indentations, and the conductive pads are located inside the indentations. In one embodiment, the indentations are circular in shape. In other embodiments, the indentations are rectangular or v-shaped.

The invention also includes a method for forming such conductive pads on the board edge. In an embodiment, a plated-through hole is made in the material of the printed circuit board. The plated-through hole is electrically coupled to a test node on the board within the circuit that is to be tested. Then, a portion of the plated-through hole is removed by removing a portion of the circuit board material that surrounds and defines the hole. Whichever part of the plated-through hole remains on the printed circuit board is thus exposed at the newly-created board edge and provides board-edge access to the test node. Preferably, approximately half of the plated-through hole is removed, resulting in an indentation on the board edge having the approximate shape of a half circle. The method may also be performed using multiple plated-through holes, each preferably centered along a line and coupled to different test nodes. The partial removal of the multiple through holes may be performed in one step with a router. In this manner, multiple edge-accessible test pads may be created with only a single pass of the router down the center line of the through holes.

The invention also includes a method for testing electrical characteristics of a printed circuit board assembly by touching a test probe to an edge-accessible test pad on the board where the test pad is coupled to a test node within the board's circuitry, conducting the test of the circuitry using the electrical connection formed between the probe and pad, and then removing the probe from the test pad. Preferably, the direction of the force applied to the circuit board by the probe is substantially in the same plane as the circuit board itself. Forces thus applied tend to be far less destructive of the board than are forces applied orthogonally to the plane of the board.

DETAILED DESCRIPTION OF THE PREFERRED EMBODIMENTS

Figure 1:
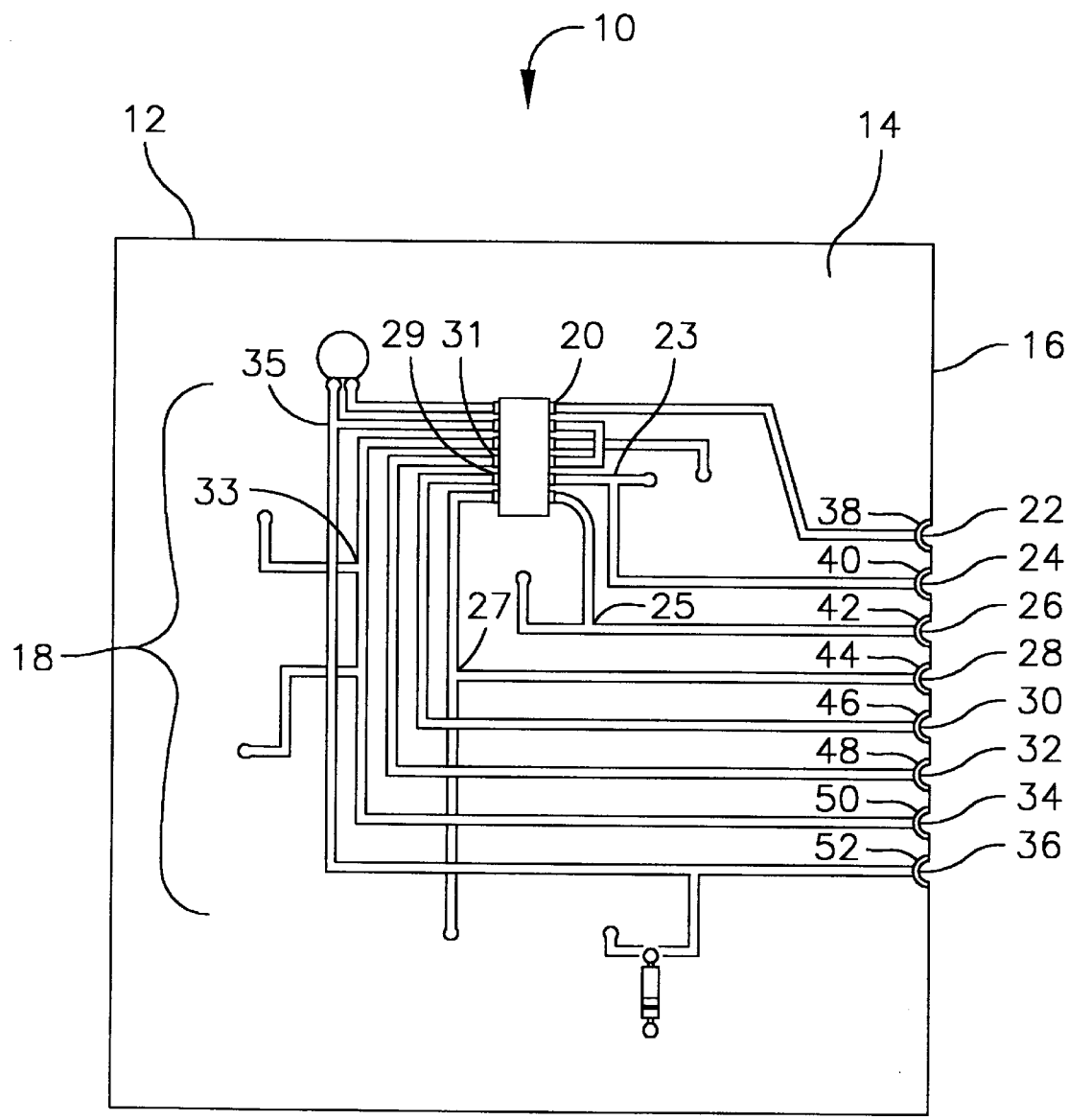
FIG. 1 is a top view of a circuit board according to a preferred embodiment of the invention.

FIG. 1 illustrates a circuit board 10 according to a preferred embodiment of the invention. Circuit board 10 is constructed using a board 12 having a planar surface 14 and a board edge 16. It is believed that any common substrate material may be used to form board 12, although the most popular material used in connection with plated-through hole technology is epoxy-fiberglass. Circuitry 18 may be formed on planar surface 14 in any conventional manner, such as by screening or photoprinting or with the use of a discrete-wire interconnection technology. Circuitry 18 and circuit board 10 may be single-sided, double-sided or multilayered, and may include surface mounted components and plated-through hole mounted components. (The particular form of circuitry 18 shown in FIG. 1 is illustrative only, and is meant to be representative of all of the above technologies.) Circuitry 18 includes test nodes 20, 23, 25, 27, 29, 31, 33 and 35, which are electrically coupled to conductive pads 22, 24, 26, 28, 30, 32, 34 and 36 respectively by printed circuit traces. Again, circuitry 18 is meant to be representative only; the number of test nodes shown and their particular locations were arbitrarily chosen here for the sake of illustration. Any number of nodes may be chosen in any location without deviating from the scope of the invention. As can be seen in the drawing, conductive pads 22–36 are located within indentations 38–52, respectively. Each of indentations 38–52 has the approximate shape of a half circle. Although the size of indentations 38–52 and the spacing between them may be varied in order to accommodate different test probe sizes without deviating from the scope of the invention, it has been found that a convenient diameter for indentations 38–52 is on the order of 0.08 inches for many applications. Likewise, a convenient spacing between indentations 38–52 has been found to be on the order of 0.18 inches from center to center.

Figure 2:
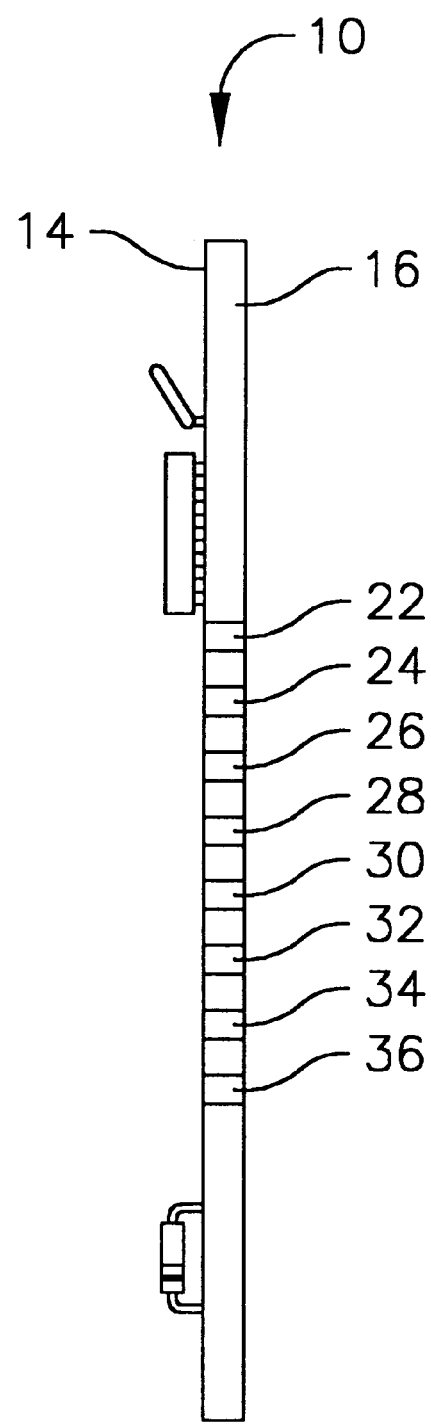
FIG. 2 is a side view of the circuit board of FIG. 1.

Board edge 16 can be seen best in FIG. 2. The thickness of circuit boards vary, depending on the number of conductor layers used and the type of laminate material used. It is believed that a board of virtually any thickness may be used to implement the invention, provided that it has enough thickness to attach conductive pads 22–36 to board edge 16. It is believed that a typical thickness for board edge 16 would be on the order of 0.062 inches.

Figure 3:
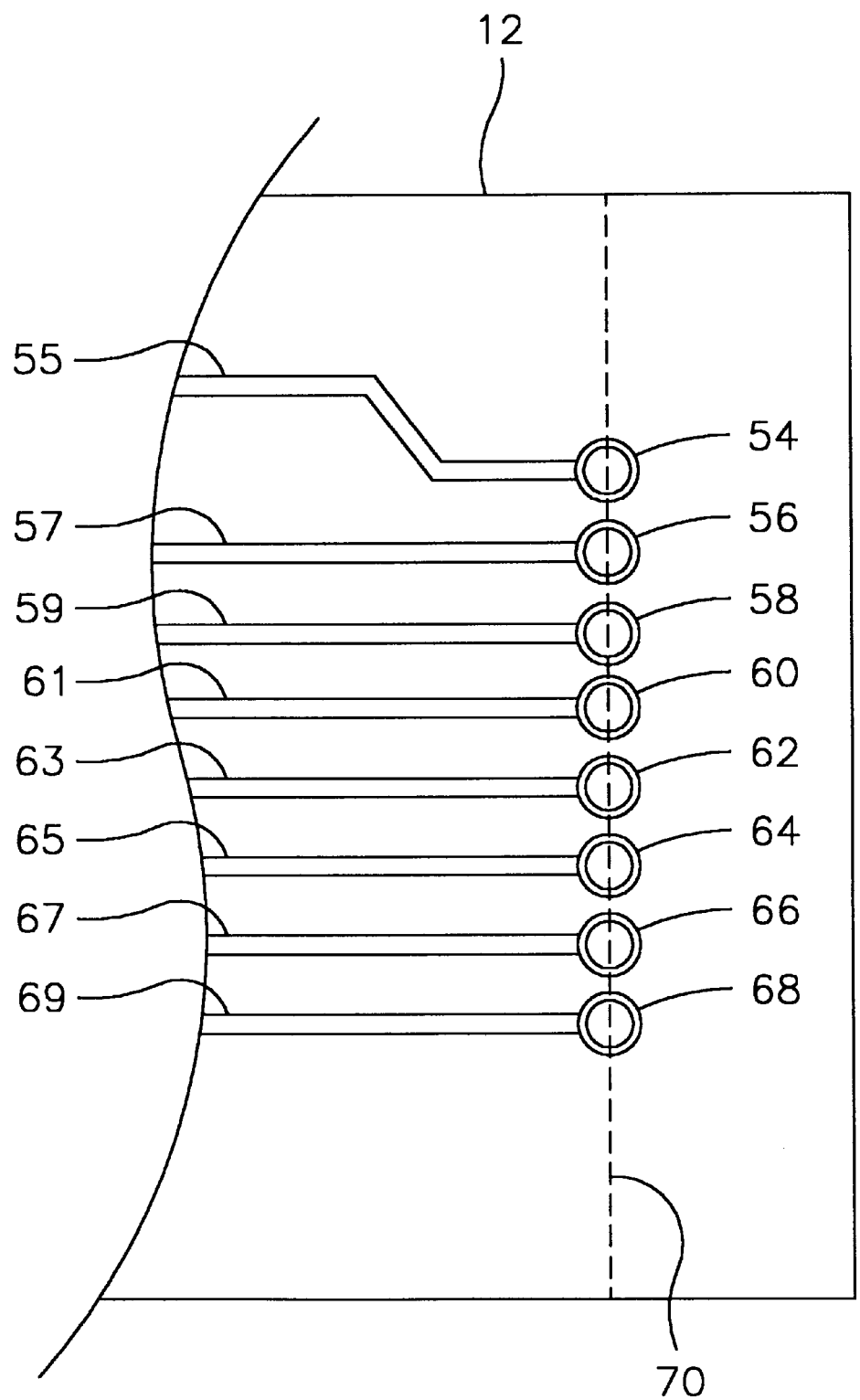
FIG. 3 is a top view of the circuit board of FIG. 1 during a first intermediate step in its manufacture.
Figure 4:
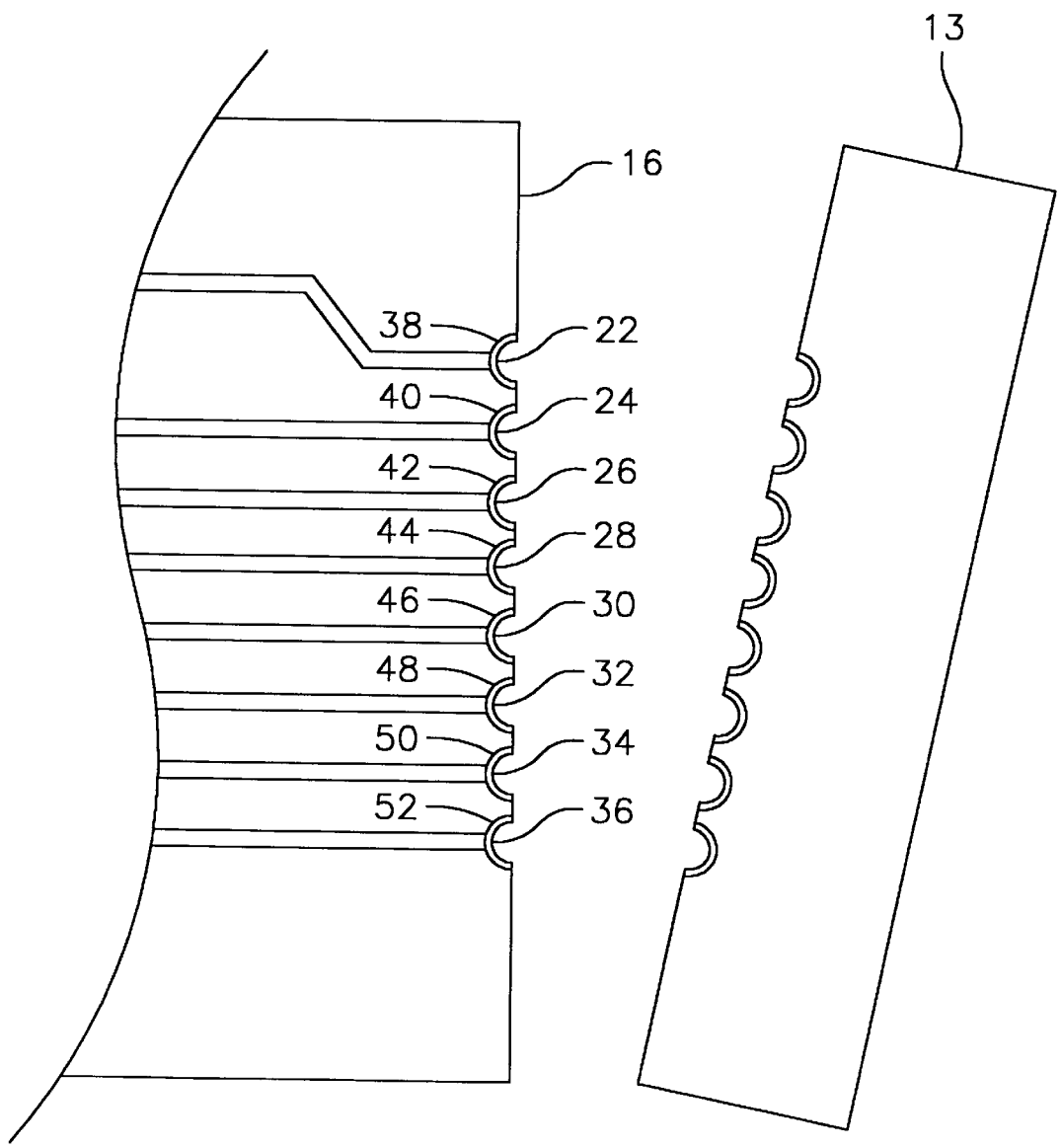
FIG. 4 is a top view of the circuit board of FIG. 1 during a second intermediate step in its manufacture.

FIGS. 3 and 4 illustrate first and second intermediate steps in a preferred process for manufacturing circuit board 10. Plated-through holes 54–68 are made in the material of board 12. Techniques for making plated-through holes in a circuit board are well known and are described, for example, in Clyde F. Coombs, Jr., *Printed Circuits Handbook*, 3rd Ed. (McGraw Hill 1988), entirely incorporated herein by reference. Plated-through holes 54–68 are electrically coupled to test nodes (not shown in FIGS. 3 or 4) by means of printed circuit traces 55–69. Although printed circuit traces are shown in the drawing, any suitable means may be used to electrically coupled plated-through holes 54–68 to the test nodes, such as discrete-wire interconnection. As shown in FIG. 4, a portion 13 of board 12 is then removed, so as to create a new board edge 16 and to expose part of the plating that was contained in plated-through holes 54–68. The plating thus exposed forms conductive pads 22–36. If a plurality of plated-through holes 54–68 are centered on a line 70, then one pass with a router along line 70 is all that is needed to create a plurality of conductive pads 22–36 on board edge 16. Preferably, about half of each of the plated-through holes 54–68 should be removed during the routing step, so that indentations 38–52 will have the approximate shape of a half-circle. It has been found that such a shape is not only convenient to manufacture, but also facilitates the alignment of test probes with conductive pads 22–36.

FIGS. 5–8 illustrate alternative embodiments of the invention using differently shaped indentations and conductive pads.

Figure 5:
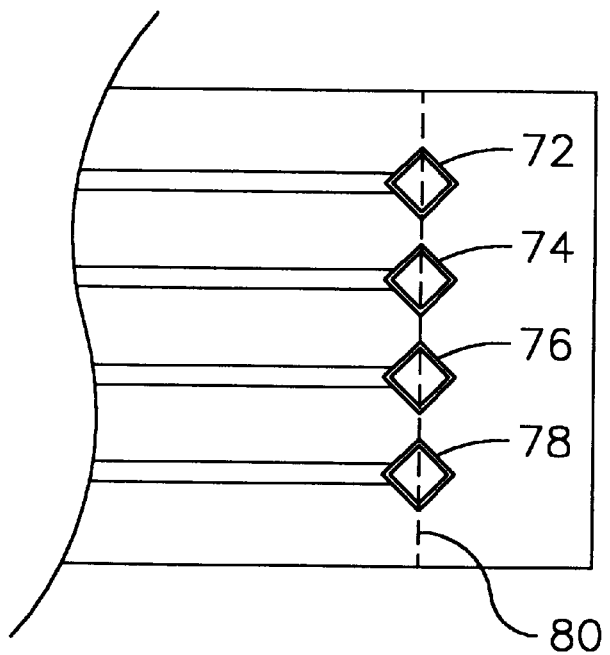
FIG. 5 is a top view of a circuit board according to a first alternate preferred embodiment of the invention.
Figure 6:
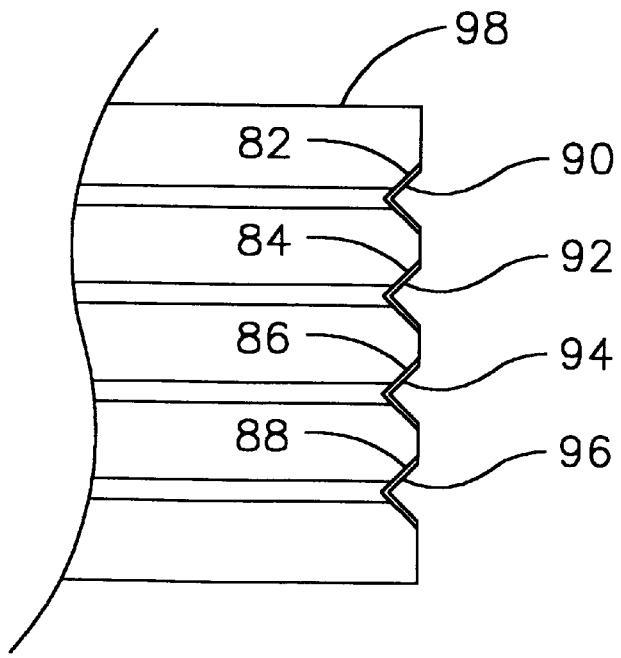
FIG. 6 is a top view of the circuit board of FIG. 5 during an intermediate step in its manufacture.

FIG. 5 illustrates a circuit board having four diamond-shaped plated-through holes 72–78 electrically coupled by printed circuit traces to test nodes (not shown). FIG. 6 illustrates the final appearance of the circuit board of FIG. 5 after part of the circuit board material has been removed along line 80. The result of the removal process is the formation of four v-shaped indentations 82–88 along the newly-created board edge 98, each indentation containing a v-shaped conductive pad 90–96.

Figure 7:
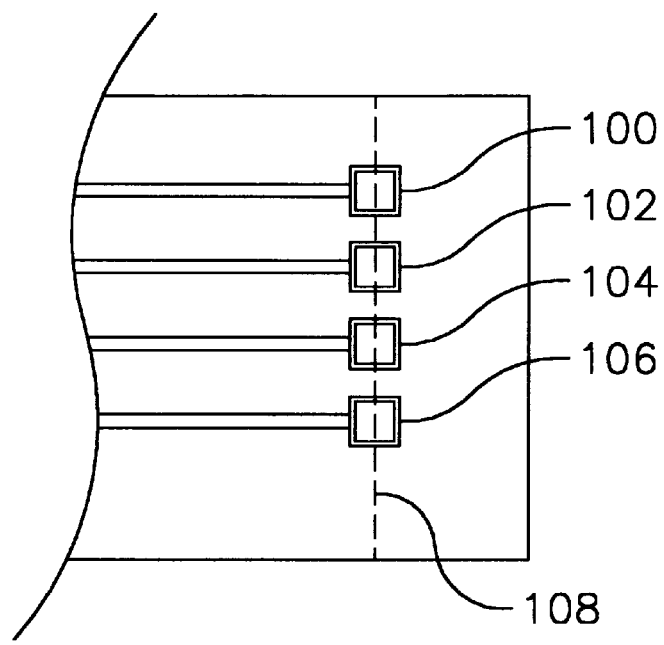
FIG. 7 is a top view of a circuit board according to a second alternate preferred embodiment of the invention.
Figure 8:
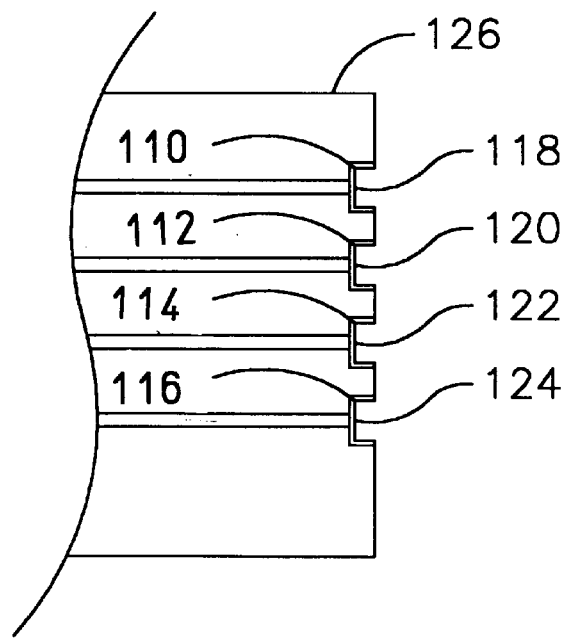
FIG. 8 is a top view of the circuit board of FIG. 7 during an intermediate step in its manufacture.

FIG. 7 illustrates a circuit board having four square-shaped plated-through holes 100–106 electrically coupled by printed circuit traces to test nodes (not shown). FIG. 8 illustrates the final appearance of the circuit board of FIG. 7 after part of the circuit board material has been removed along line 108. The result of the removal process is the formation of four half-square-shaped indentations 110–116 along the newly-created board edge 126, each indentation containing a half-square-shaped conductive pad 118–124. It is believed that different shapes for the indentations and conductive pads may facilitate the alignment of test probes having complementary shapes.

Figure 9:
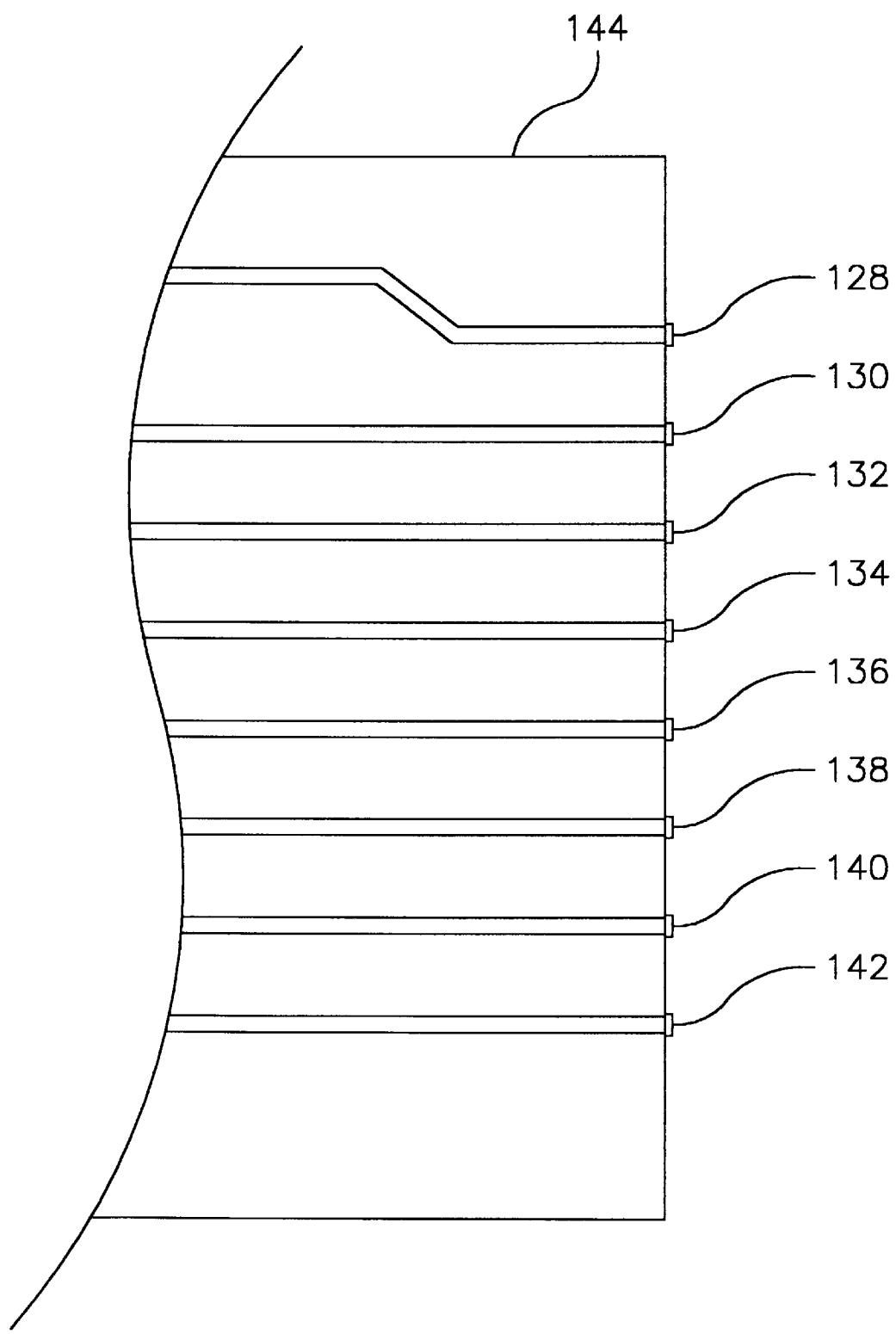
FIG. 9 is a top view of a circuit board according to a third alternate embodiment of the invention.
Figure 10:
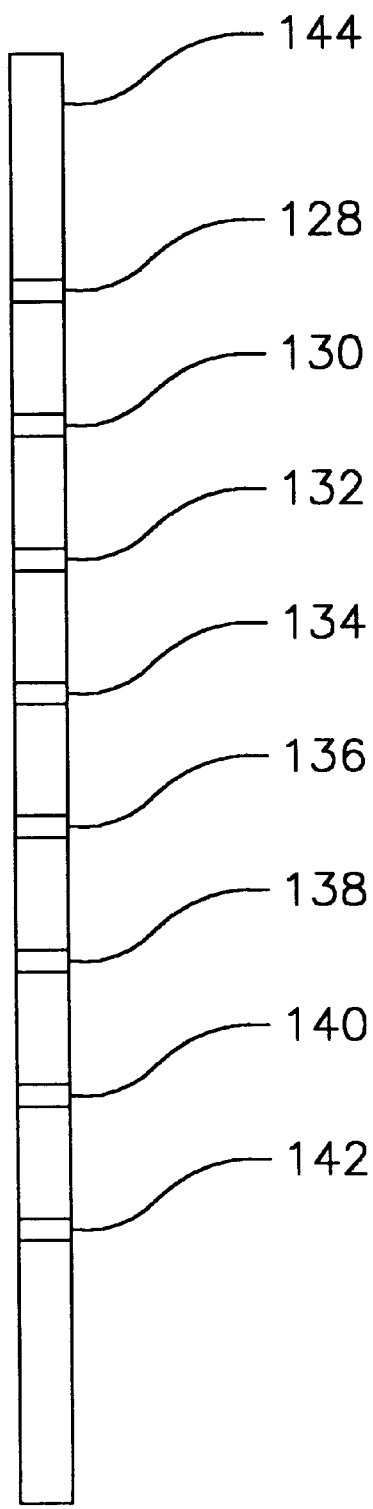
FIG. 10 is a side view of the circuit board of FIG. 9.

Yet another alternative embodiment is shown in FIGS. 9 and 10. In the embodiment of FIGS. 9 and 10, circuit board edge 144 has no indentations. Instead, conductive pads 128–142 are formed directly on the board edge using any conventional plating procedure, such as those described in Coombs, supra, or by a subtractive process such as etching. As in the embodiments previously described, conductive pads 128–142 are electrically coupled by printed circuit traces to test nodes (not shown). Circuit boards having indentations, like those of FIGS. 1, 6 and 8, may also be manufactured in this manner by first creating suitable indentations on the board edge and then performing the plating or etching procedure to form the conductive pads in the indentations.

Figure 11:
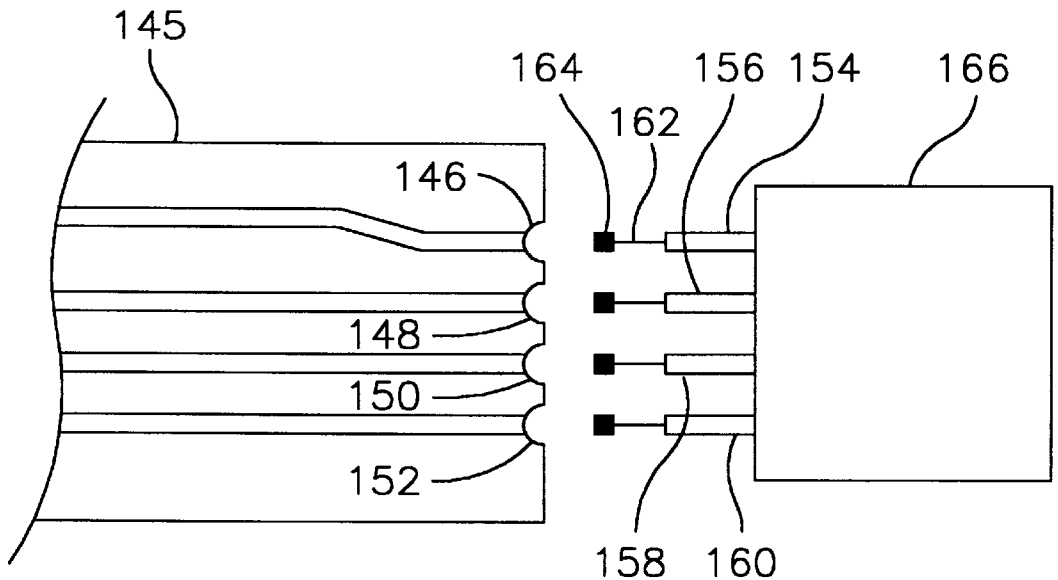
FIG. 11 is a top view of a circuit board and test fixture as they would appear before and after testing the circuit board according to a preferred embodiment of the invention.
Figure 12:
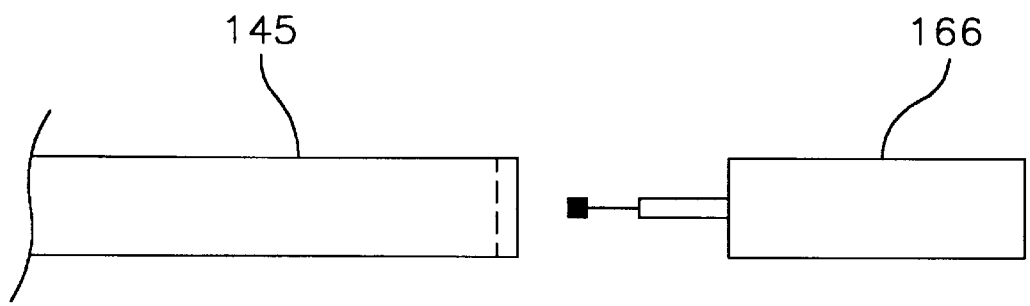
FIG. 12 is a side view of a circuit board and test fixture as they would appear before and after testing the circuit board according to a preferred embodiment of the invention.

FIGS. 11–14 illustrate a preferred procedure for testing a printed circuit board using conductive pads formed on the edge of the board. FIG. 11 illustrates a circuit board 145 having conductive pads 146–152 formed on the board edge. Test fixture 166 supports test probes 154–160. Each of test probes 154–160 includes a spring-loaded stem 162 and a test head 164 at the end of stem 162. FIG. 12 is a side view of the circuit board and test fixture shown in FIG. 11. During the preferred test procedure, circuit board 145 and test fixture 166 are brought into alignment so that test probes 154–160 will engage conductive pads 146–152, respectively, when circuit board 145 and test fixture 166 are moved toward one another.

Figure 13:
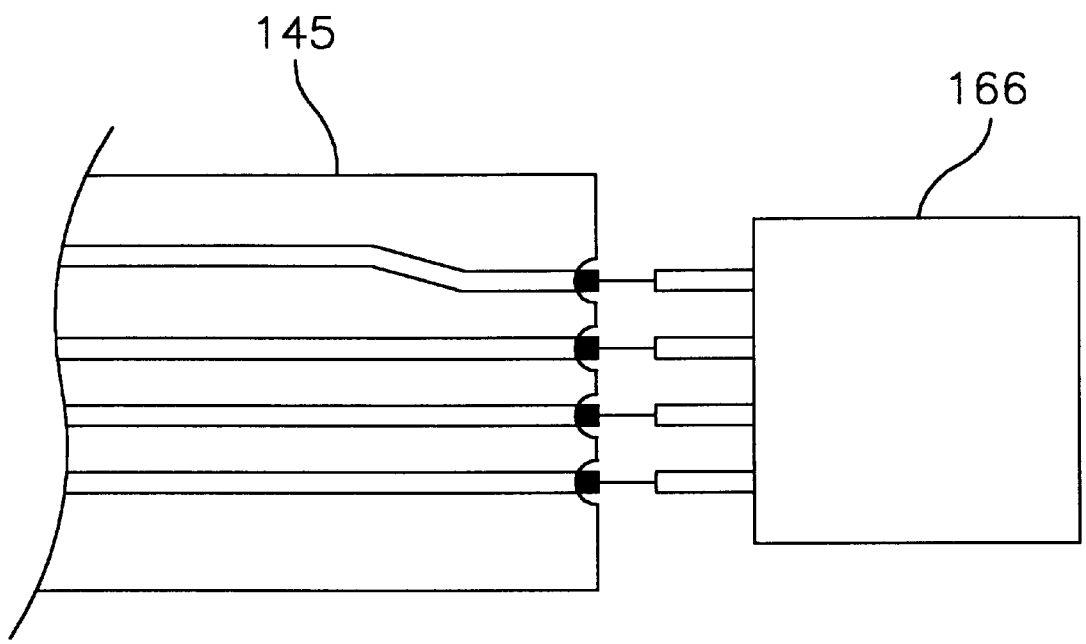
FIG. 13 is a top view of a circuit board and test fixture as they would appear during the testing of the circuit board according to a preferred embodiment of the invention.
Figure 14:
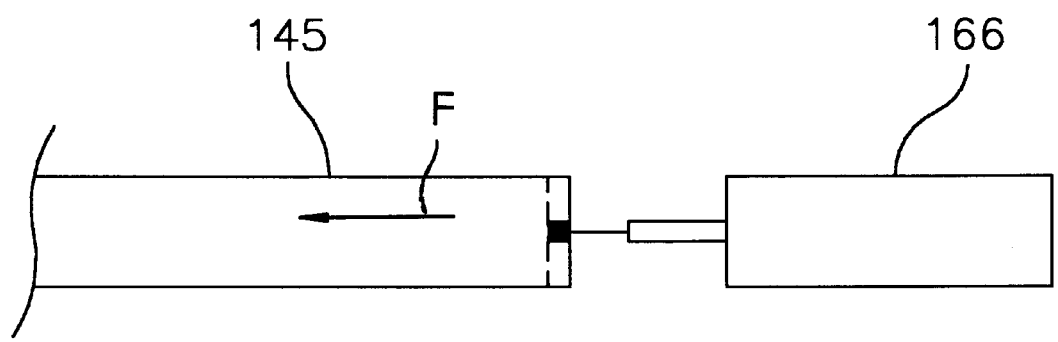
FIG. 14 is a side view of a circuit board and test fixture as they would appear during the testing of the circuit board according to a preferred embodiment of the invention.

FIGS. 13 and 14 illustrate the appearance of circuit board 145 and test fixture 166 during testing. (FIG. 14 is a side view of FIG. 13) Circuit board 145 and test fixture 166 are moved closer until the test heads 164 engage the conductive pads 146–152 and the spring loaded stems 162 begin to compress. In a typical application, relative movement is stopped when approximately between three and eight ounces of force is applied to circuit board 145 by each test probe. (Those having ordinary skill in the art will appreciate that actual forces vary from application to application and depend on such factors as probe type and probe length.) After automatic testing is conducted by test fixture 166 using the electrical connections formed between test probes 154–160 and conductive pads 146–152, test probes 154–160 may be removed from circuit board 145 by simply moving circuit board 145 away from test fixture 166.

One significant advantage of the arrangement shown is that, during testing, the force F of the test probes is applied to circuit board 145 in a direction that is substantially coplanar with circuit board 145, as can be seen in FIG. 14. Such an arrangement causes less deformation in circuit board 145 than if the same force were applied in a direction orthogonal to the planar surface of the board.

While the invention has been described above in detail in relation to certain preferred embodiments, the foregoing description is not intended to be exhaustive or to limit the invention to the precise forms described. Modifications or variations are possible in light of the above teachings and will be apparent to those having ordinary skill in the art and having reference hereto. For example, although the invention has been described in relation to the use of spring-loaded test probes, any type of test probe or means of electrical contact, including non-spring-loaded probes or contacts, may be used in connection with the disclosed circuit board without deviating from the scope of the invention. Moreover, although the invention has been described in relation to the testing of circuit boards and circuit board assemblies during their manufacture, the invention could also be applied in finished products as a means for providing connections to circuit boards mounted in a rack, fixture or frame. The invention may also be used in combination with existing techniques such as plug-and-socket-type connectors. For example, the techniques of the invention were added to a small computer system interface ("SCSI") card to provide a useful and inexpensive board-edge serial interface to be used for testing purposes in addition to the plug-and-socket-type parallel interface that already existed on the card. All such modifications and variations are within the scope of the invention as defined by the appended claims when interpreted in accordance with the breadth to which they are fairly, legally and equitably entitled.

We claim:

1. A method of testing electrical characteristics of a circuit board assembly, comprising the steps of:

making a line of plated through holes in the circuit board material;

electrically coupling the plated through holes to test nodes of a circuit formed on a planar portion of the circuit board;

removing a portion of the circuit board material defining the plated through holes so as to create a board edge that exposes part of the plating that was contained in the plated through holes, the exposed plating in each plated through hole forming a conductive pad, and the board edge oriented substantially orthogonal to the planar portion of the circuit board;

establishing a coplanar alignment between the circuit board and a line of test probes mounted to a test fixture, each of the test probes having a spring-loaded stem and a test head for engaging one of the conductive pads;

bringing the conductive pads and the test heads into contact with each other using a force that is applied parallel with the spring-loaded stems, coplanar with the circuit board and orthogonal to the board edge until the spring-loaded stems are at least partially depressed; and testing the circuit board assembly using the electrical connections established between the conductive pads and the test heads.

2. The method of claim 1, wherein the plated through holes are circular, and wherein the removing step comprises removing approximately half of the plated through holes so as to form indentations along the board edge having the approximate shapes of circles.

3. The method of claim 1, wherein the plated through holes are rectangular, each of them oriented with two sides parallel to the board edge and two sides orthogonal to the board edge, and wherein the removing step comprises bisecting the sides of the through holes that are orthogonal to the board edge so as to form indentations along the board edge having the approximate shapes of half rectangles, each indentation containing two corners.

4. The method of claim 1, wherein the plated through holes are rectangular, each of them oriented with two sides at approximately 45 degrees relative to the board edge, and wherein the removing step comprises bisecting the through holes at two opposite corners so as to form indentations along the board edge having the approximate shapes of half rectangles, each indentation containing one corner.

* * * * *